United States Patent
Huang et al.

(10) Patent No.: US 11,447,054 B2
(45) Date of Patent: Sep. 20, 2022

(54) METHOD FOR TRANSFERRING CONTAINER

(71) Applicant: Taiwan Semiconductor Manufacturing Company, Ltd., Hsinchu (TW)

(72) Inventors: Yi-Tang Huang, Taichung (TW); Yuan-Yu Feng, Tainan (TW); Chia-Han Lin, New Taipei (TW); Chien-Fa Lee, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 42 days.

(21) Appl. No.: 17/078,396

(22) Filed: Oct. 23, 2020

(65) Prior Publication Data
US 2021/0039545 A1 Feb. 11, 2021

Related U.S. Application Data

(63) Continuation of application No. 15/873,061, filed on Jan. 17, 2018, now Pat. No. 10,821,871.
(Continued)

(51) Int. Cl.
| H01L 21/67 | (2006.01) |
| B60P 1/64 | (2006.01) |
| B65D 90/00 | (2006.01) |
| H01L 21/677 | (2006.01) |
| G06T 7/00 | (2017.01) |

(Continued)

(52) U.S. Cl.
CPC ........... *B60P 1/6418* (2013.01); *B60P 1/6409* (2013.01); *B65D 90/0033* (2013.01);
(Continued)

(58) Field of Classification Search
CPC .. B60P 1/6418; B60P 1/6409; B65D 90/0033; B66C 1/663; G06T 7/0008;
(Continued)

(56) References Cited

U.S. PATENT DOCUMENTS

| 8,189,867 B2 | 5/2012 | Yoshioka |
| 2005/0208842 A1 | 9/2005 | Lin et al. |
| 2019/0248581 A1* | 8/2019 | Adachi ............... B65G 1/1373 |

FOREIGN PATENT DOCUMENTS

| CN | 1797731 A | 7/2006 |
| CN | 104617027 A | 5/2015 |

(Continued)

OTHER PUBLICATIONS

Chinese language office action dated Jan. 25, 2021, issued in application No. CN 201810596818.2.
(Continued)

*Primary Examiner* — Phuoc Tran
(74) *Attorney, Agent, or Firm* — McClure, Qualey & Rodack, LLP

(57) ABSTRACT

A method for transferring a container configured to hold at least one article used in semiconductor fabrication is provided. The method includes moving a transferring mechanism to a first position that is adjacent to the original space; producing an image of an edge of the container that is adjacent to the original space using an optical receiver before the container is moved to a destination space; and performing an image analysis of the image to determine whether to move the container to the destination space.

20 Claims, 12 Drawing Sheets

Related U.S. Application Data

(60) Provisional application No. 62/583,054, filed on Nov. 8, 2017.

(51) Int. Cl.
 *B66C 1/66* (2006.01)
 *H01L 21/68* (2006.01)

(52) U.S. Cl.
 CPC ............ *B66C 1/663* (2013.01); *G06T 7/0008* (2013.01); *H01L 21/6773* (2013.01); *H01L 21/67259* (2013.01); *H01L 21/67769* (2013.01); *H01L 21/67775* (2013.01); *H01L 21/681* (2013.01); *B65G 2203/041* (2013.01)

(58) Field of Classification Search
 CPC .......... H01L 21/67259; H01L 21/6773; H01L 21/67769; H01L 21/67775; H01L 21/681; B65G 2203/041; B66F 9/07; B66F 9/24
 See application file for complete search history.

(56) References Cited

FOREIGN PATENT DOCUMENTS

| | | |
|---|---|---|
| JP | H08-119411 A | 5/1996 |
| JP | H10-308429 A | 11/1998 |
| JP | 2003-285903 A | 10/2003 |
| JP | 2010-83593 A | 4/2010 |
| KR | 10-2004-0021985 A | 3/2004 |
| KR | 10-2005-0115669 A | 12/2005 |

OTHER PUBLICATIONS

Chinese language office action dated Jan. 16, 2019, issued in application No. TW 107115935.
Chinese language office action dated Jun. 12, 2020, issued in application No. CN 201810596818.2.

\* cited by examiner

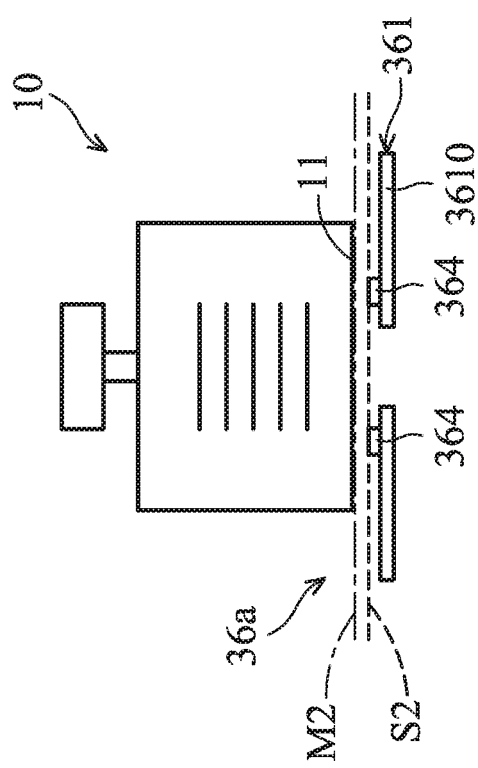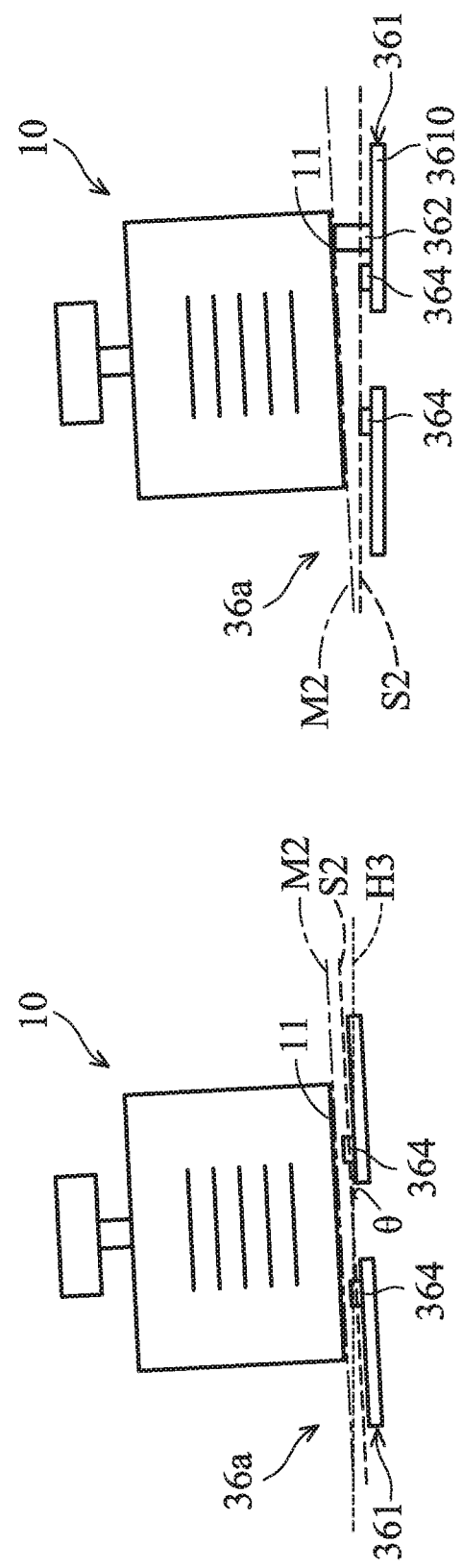

METHOD FOR TRANSFERRING CONTAINER

PRIORITY CLAIM AND CROSS-REFERENCE

This application is a Continuation Application of U.S. patent application Ser. No. 15/873,061, filed on Jan. 17, 2018, now U.S. Pat. No. 10,821,871, which claims priority of U.S. Provisional Application No. 62/583,054, filed on Nov. 8, 2017, the entirety of which are incorporated by reference herein.

BACKGROUND

In the process of manufacturing a semiconductor device, transporting or conveying articles for processing is a task that is performed throughout the manufacturing process. Conventionally, articles are conveyed in a fabrication plant by automatically guided vehicles or overhead transport vehicles that travel on predetermined routes or tracks. For the conveyance of articles, the articles are normally loaded into containers, such as SMIF (a standard machine interface) or FOUP (a front opening unified pod), and then picked up and placed in the automatic conveying vehicles.

A semiconductor wafer is one sort of article that may be positioned in the container, and various device elements are formed on the semiconductor wafer. Examples of device elements that are formed on the semiconductor wafer include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and other applicable elements.

Alternatively, articles positioned in the containers may include a test wafer. The test wafer is used to monitor the integrity of a work station to be used in a semiconductor device fabrication process flow. Alternatively, articles positioned in the containers may include a photomask or reticle. The photomask or the reticle is used in a photolithography operation of the semiconductor device fabrication process flow.

Although existing methods for transferring the container have generally been adequate for their intended purposes, they have not been entirely satisfactory in all respects. Consequently, it would be desirable to provide a solution for the process control for container-transfer operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 12A is an example of a third image recorded by an optical receiver in a normal condition, in accordance with some embodiments.

FIG. 12B is an example of a third image recorded by an optical receiver in an abnormal condition, in accordance with some embodiments.

FIG. 12C is an example of a third image recorded by an optical receiver in an abnormal condition, in accordance with some embodiments.

DETAILED DESCRIPTION

Figure 1:
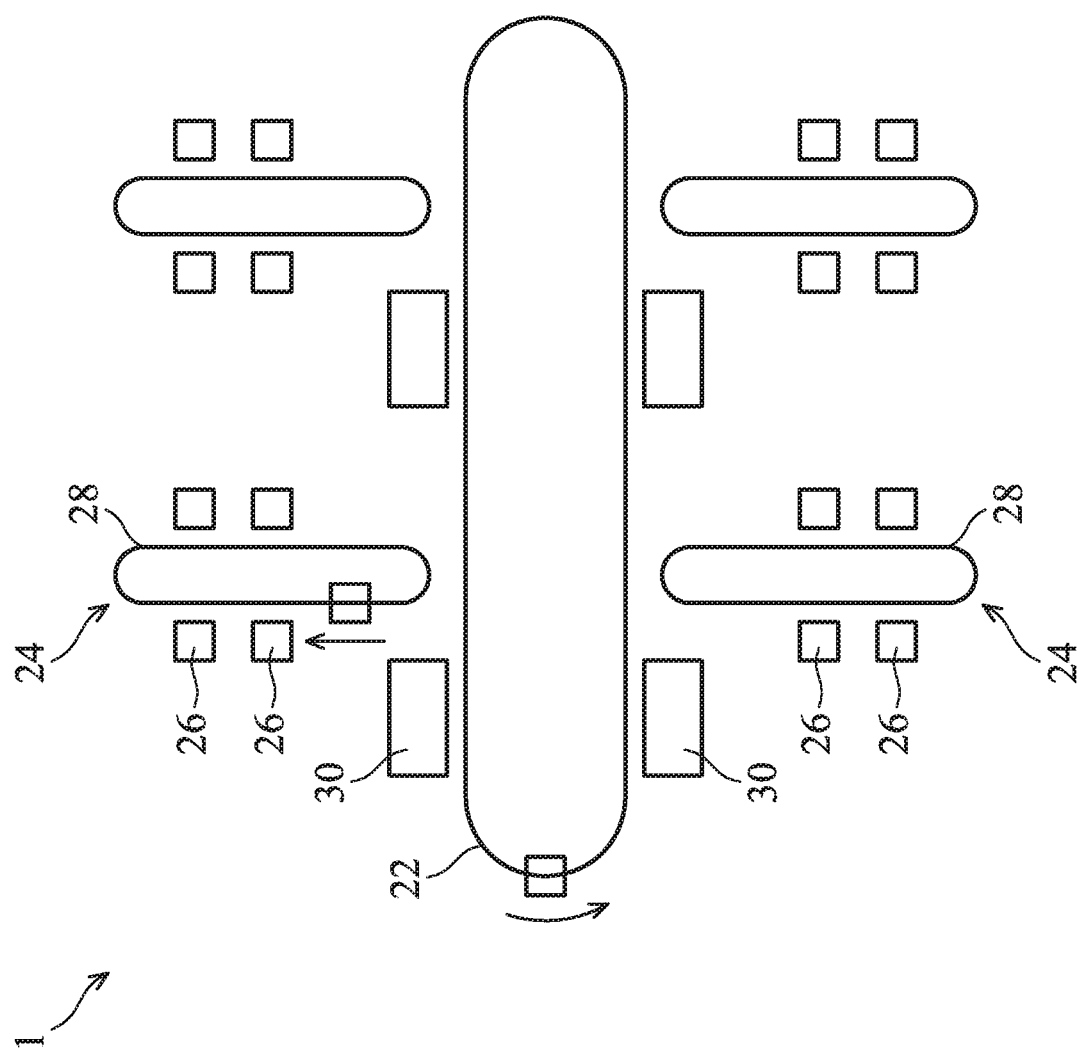
FIG. 1 is a schematic view of an automatic material handling system (AMHS), in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIG. 1 illustrates a schematic view of an automatic material handling system (AMHS) 1, in accordance with some embodiments. In some embodiments, the automatic material handling system 1 includes an inter-bay transportation apparatus 22, a number of processing bays 24, and a number of stockers 30.

The inter-bay transportation apparatus 22 is configured to convey the containers among the stockers 30. In some embodiments, the inter-bay transportation apparatus 22 is an automated transportation vehicles (AGV) system, a rail guided vehicles (RGV) system, or an overhead hoist transport (OHT) system. For simplicity, only a guided route, a guided rail or an overhead track of the inter-bay transportation apparatus 22 is illustrated in FIG. 1.

Each processing bay 24 is configured to perform a respective type of processing operation in the process flow, such as photolithography, etching, diffusion, ion implantation, deposition or passivation, in a semiconductor device fabrication process flow. In some embodiments, each processing bay 24 includes a number of processing tool 26 and an intrabay transportation apparatus 28.

In some embodiments, the processing tool 26 include a chemical mechanical polishing (CMP) apparatus, a physical vapor deposition (PVD) apparatus, a chemical vapor deposition (CVD) apparatus, an ion implant apparatus, an epitaxy apparatus, a sputter apparatus, a thermal processing apparatus, an etching apparatus, a photolithography apparatus, or another suitable apparatus. In some embodiments, the semiconductor manufacturing process includes a CMP process, a PVD process, a CVD process, an ALD process, a doping process, a screen printing process, a dry etching process, a wet etching process, a photolithography process, or another suitable process.

The intrabay transportation apparatus 28 is configured to convey the workpiece between the processing tool 26 within the processing bay 24. In some embodiments, the intrabay transportation system 28 is an AGV system, an RGV system, or an OHT system. For simplicity, only a guided route, a guided rail or an overhead track of the intrabay transportation apparatus 28 is illustrated in FIG. 1.

The stockers 30 are utilized for providing input/out to processing bays 24, or to processing tool 26 located on the processing bays 24. The inter-bay transportation apparatus 22 is used to perform lot transportation between processing bays 24. In this configuration, the stockers 30 of the automatic material handling system become the pathway for both input and output of the bays 24.

In AMHS 1, the stockers 30 are widely used in conjunction with automatically guided or overhead transport vehicles, either on the ground or suspended on tracks, for the storing and transporting of articles in containers, such as SMIF (standard machine interface) or FOUP (front opening unified pod). Three possible configurations for utilizing a stocker may be provided.

In the first configuration, a stocker is utilized for storing articles in SMIF pods and transporting them first to a first tool, then to a second tool, and finally to a third tool for three separate processing steps to be conducted on the articles. After the processing in the third tool is completed, the SMIF pod is returned to the stocker for possible conveying to another stocker.

In the second configuration, a stocker and a plurality of buffer stations are used to accommodate different processes to be conducted in the first tool, the second tool and the third tool. The container may first be delivered to a first buffer station from the stocker and may wait there for processing by the first tool. Second and third buffer stations are similarly utilized in connection with the second and third tools. In the third configuration, a stocker is provided for controlling the storage and conveying of articles to the first, second and third tools. After a container is delivered to one of the three tools, the container is always returned to the stocker before it is sent to the next processing tool.

Figure 2:
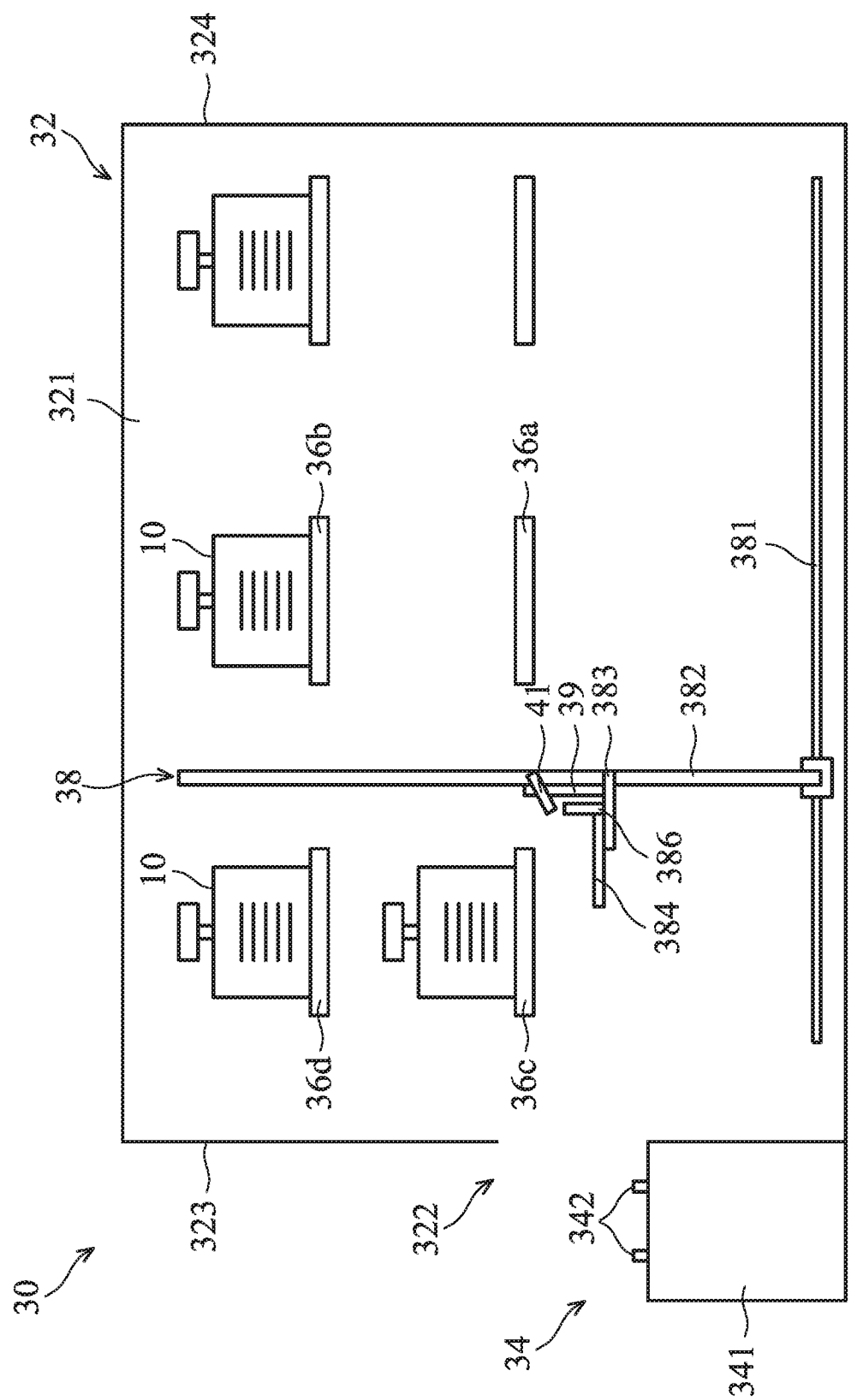
FIG. 2 is a schematic view of a stocker, in accordance with some embodiments.

FIG. 2 is a schematic view of the stocker 30, in accordance with some embodiments. The stocker 30 is configured to automation storage and retrieval. In some embodiments, the stocker 30 includes a main body 32, a load port 34, a number of storage shelves 36a, 36b, 36c and 36d and a transferring mechanism 38.

In some embodiments, the main body 32 is a rectangular enclosure and includes a longitudinal side wall 321 and two transverse side walls 323 and 324. The two transverse side walls 323 and 324 are connected to two edges of the longitudinal side wall 321. One or more openable/closeable and sealable access doors 322 are positioned on the transverse side walls 323.

The load port 34 is configured to support and dock the containers 10 for facilitating insertion and removal of containers 10 into/from the main body 32 of the stocker 30. The load port 34 is positioned along a rail of the inter-bay transportation apparatus 22 or a rail of the intrabay transportation apparatus 28 (FIG. 1) so as to receive the containers 10 transferred from the vehicle of the inter-bay transportation apparatus 22 or the intra bay transportation apparatus 28. The load ports 34 are positioned in such a way that they correspond to the access door 322 of the main body 32 for transferring containers 10 into the main body 32.

In some embodiments, as shown in FIG. 2, the load port 34 has a coupling interface 341 that includes a number of protruding coupling pins 342 corresponding to the coupling mechanisms such as the grooves (not shown in figures) of each container 10 so as to successfully couple to the container 10 and dock the container 10 at a predetermined position on the load port 34. The dimensions of the coupling pins 342 correspond to the dimensions of the coupling mechanisms of the container 10.

Figure 3:
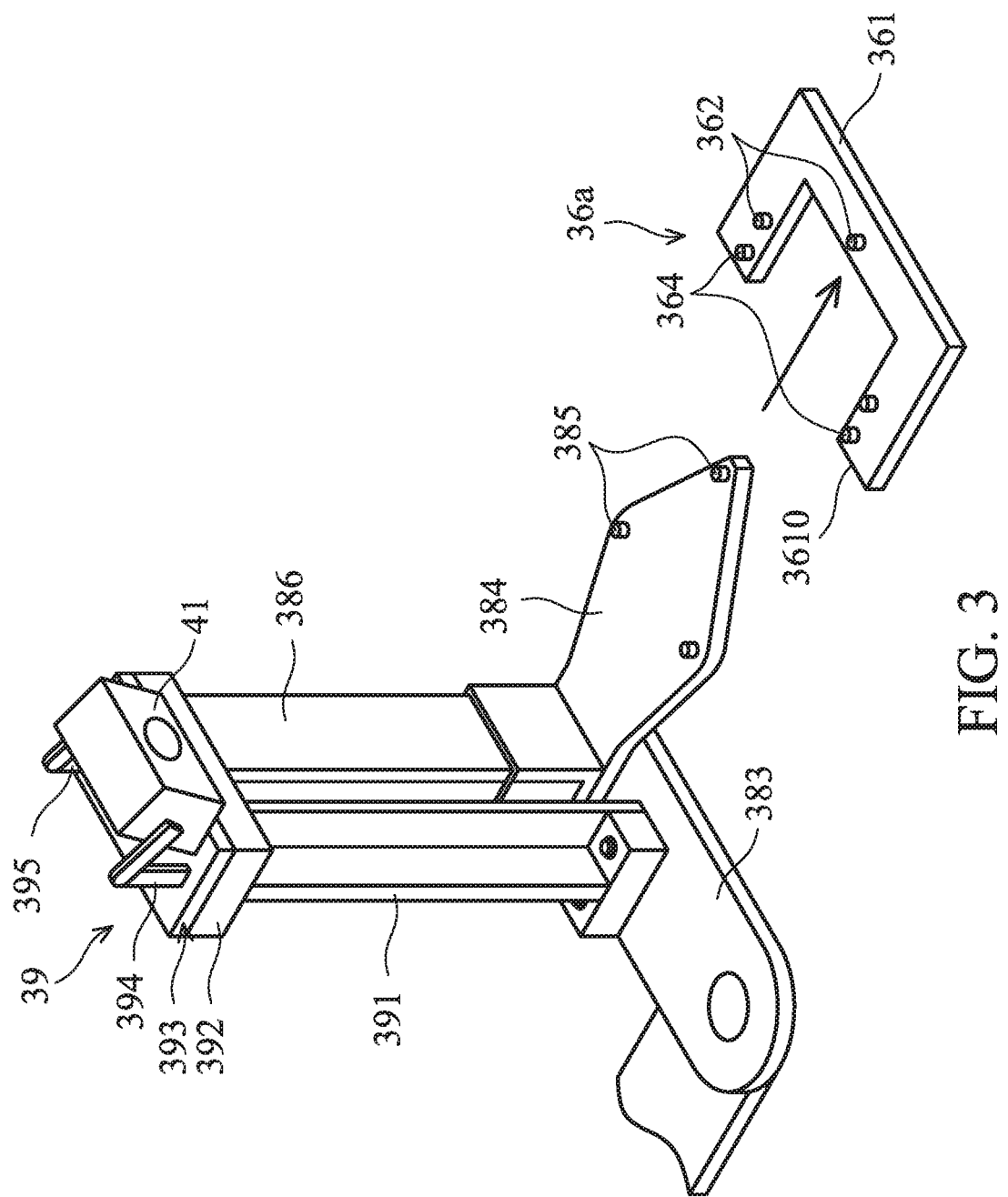
FIG. 3 is a schematic view of a transferring mechanism and a storage shelve, in accordance with some embodiments.

The storage shelves 36a, 36b, 36c and 36d are configured to facilitate the storing of the containers 10 within the main body 32. In some embodiments, the storage shelves 36a, 36b, 36c and 36d are positioned on the main body 32, such as on the longitudinal side wall 321 and the other longitudinal side wall. In some embodiments, as shown in FIG. 3, the storage shelf 36a includes a plate 361, a number of coupling pins 362 and a number of embossments 364. The plate 361 has a U-shape and is used to support the container 10 when the container 10 is positioned on the storage shelf 36a. However, it should be noted that the configuration of the plate should not be limited to that shown in FIG. 4.

The coupling pins 362 are positioned on an upper surface of the plate 361. The coupling pins 362 correspond to the coupling mechanisms such as the grooves (not shown in figures) of each container 10 so as to successfully couple to the container 10 and dock the container 10 at a predetermined position on the storage shelf 36a. The dimensions of the coupling pins 362 correspond to the dimensions of the coupling mechanisms of the container 10. Two embossments 364 are formed on the upper surface of the plate 361. The two embossments 364 are immediately connected to the front edge 3610 of the plate 361, in accordance with some embodiments. The two embossments 364 are used for positioning the robotic arm 383 (which will described later) of the transferring mechanism 38.

Referring back to FIG. 2, the transferring mechanism 38 is configured to move the container 10 within the stocker 30. In some embodiments, the transferring mechanism 38 includes a rail 381 and a crane 382, and a robotic arm 383. The crane 382 and the rail 381 are configured to move the robotic arm 383 along the length of the longitudinal side wall 321. The crane 382 is also configured to move the robotic arm 383 along the height of the longitudinal side wall 321. The length and height of the longitudinal side wall 321 are respectively parallel to and perpendicular to the floor of a FAB. The robotic arm 383 is configured to move the container 10 along a plane that is perpendicular to the longitudinal side wall 321.

A number of elements which are going to be moved by the transferring mechanism 38 during the movement of the container 10 are located on the robotic arm 383. For example, the transferring mechanism 38 further includes a blade 384, a guard plate 386 and a supporting assembly 39. The blade 384, the guard plate 386 and the supporting assembly 39 are positioned on the robotic arm 383. According to some embodiments, the configuration of the blade 384, the guard plate 386 and the supporting assembly 39 are described below.

The blade 384 is configured for directly supporting the container 10 while the container transfer. In some embodiments, as shown in FIG. 3, a number of coupling pins 385 are positioned on an upper surface of the blade 384. The coupling pins 385 correspond to the coupling mechanisms such as the grooves (not shown in figures) of each container 10 so as to successfully couple to the container 10 and dock the container 10 at a predetermined position on the blade 384. The dimensions of the coupling pins 385 correspond to the dimensions of the coupling mechanisms of the container 10.

The guard plate 386 is connected to a rear side (a side that is opposite to a front side which directly faces the storage shelf 36a) of the blade 384. The guard plate 386 is perpendicular to the blade 384 and is configured to protect the container 10 from being dropped while it is being conveyed. The configurations of the storage shelves 36b, 36c and 36d are similar to the configurations of the storage shelf 36a and will not be repeated, for brevity.

The supporting assembly 39 is configured to support an optical receiver 41 (which will be described later). In some embodiments, the supporting assembly 39 includes a stand 391, a lower mounting member 392, and an upper mounting member 393. The stand 391 is vertically positioned on the robotic arm 383 and is located adjacent to the blade 384. The height of the stand 391 may be greater than the height of the guard plate 386.

The lower mounting member 392 is fixed on an upper end of the stand 391. The upper mounting member 393 is detachably connected to the lower mounting member 392. In some embodiments, the upper mounting member 393 is connected to the lower mounting member 392 via fastening members, such as screws. The upper mounting member 393 may include two brackets 394 and 395 connected to one another by a hinge, and the angle between the two brackets 394 and 395 can be adjusted automatically or manually.

Figure 4:
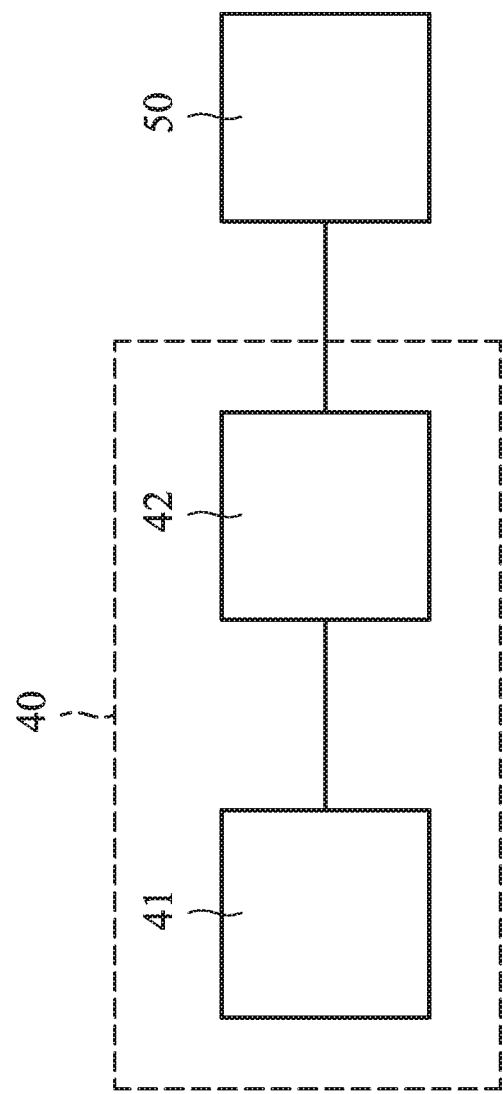
FIG. 4 is a block diagram of a monitoring module and a control module, in accordance with some embodiments.

Referring to FIG. 4 with reference to FIG. 3, the monitoring module 40 includes an optical receiver 41 and an image processor 42, in accordance with some embodiments. As shown in FIG. 3, the optical receiver 41 is positioned at the supporting assembly 39 such that the optical receiver 41 is moved to a particular position in the main body 32 (FIG. 2). In some embodiments, the optical receiver 41 includes a charge-coupled device (CCD).

Specifically, the optical receiver 41 is mounted on the upper mounting member 393 of the supporting assembly 39. The position and the orientation angle of the optical receiver 41 can be adjusted by changing the position of the upper mounting member 393 on the lower mounting member 392 or by changing the angle between the two brackets 394 and 395. The optical receiver 41 is used to investigate particular objects or locations in the stocker 30.

Referring FIG. 4 again, the image processor 42 is connected to the optical receiver 41 to receive the electronic signal from the optical receiver 41. Then the image processor 42 analyzes the image to produce an image analysis result regarding the image investigated by the optical receiver 41.

The FDC module 50 is configured to detect faults within the stocker 30. The FDC module 50 monitors parameters associated with the stocker 30 and evaluates the parameters to detect abnormalities, or faults, during operation of the stocker 30. In some embodiments, the FDC module 50 receives an image analysis result from the image processor 42 and determines if abnormalities or faults occur during the transportation of the container 10 in the stocker 30.

The FDC module 50 may be a computer system. In one example, the computer system includes a network communications device or a network computing device (for example, a mobile cellular phone, a laptop, a personal computer, a network server, etc.) capable of communicating with a network. In accordance with embodiments of the present disclosure, the computer system performs specific operations via a processor executing one or more sequences of one or more instructions contained in a system memory component. In one example, such instructions are read into a system memory component from another computer readable medium, such as a static storage component or a disk drive component. In another example, hard-wired circuitry is used in place of (or in combination with) software instructions to implement the present disclosure.

Figure 5:
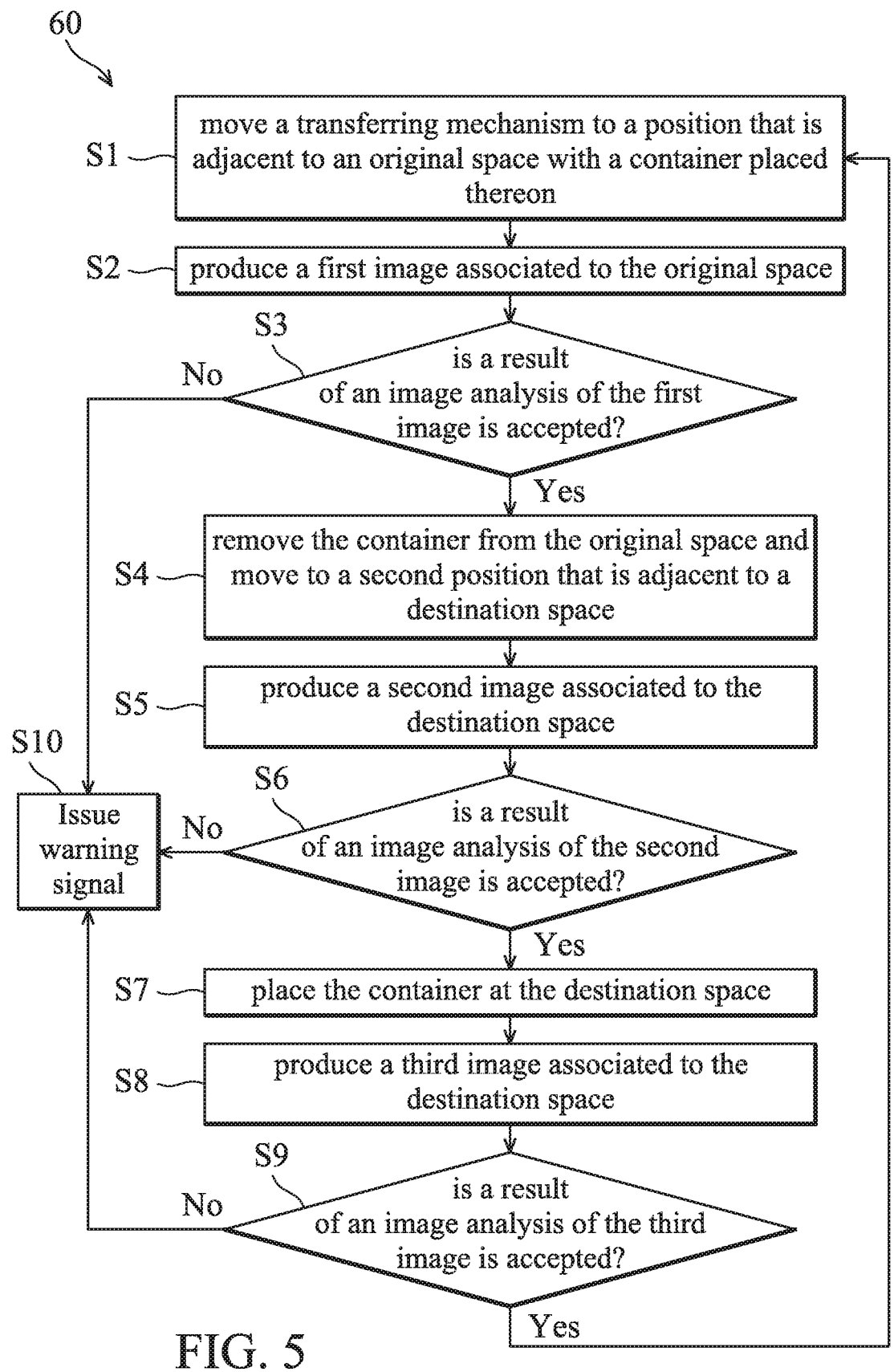
FIG. 5 is a flow chart illustrating a method for transferring a container, in accordance with some embodiments.

FIG. 5 is a flow chart illustrating a method 60 for transferring the container 10 in the stocker 30, in accordance with some embodiments. For illustration, the flow chart will be described in company with the schematic views shown in FIGS. 1-4 and 6-12C. Some of the stages described can be replaced or eliminated for different embodiments.

The following discussion will use the transfer of the container 10 from the load port 34 to one of the storage shelves 36a as an example. The load port 34 is referred to as the original space, and the storage shelf 36a where the container is going to be deposited is referred to as the destination space for the purpose of illustration.

Figure 6:
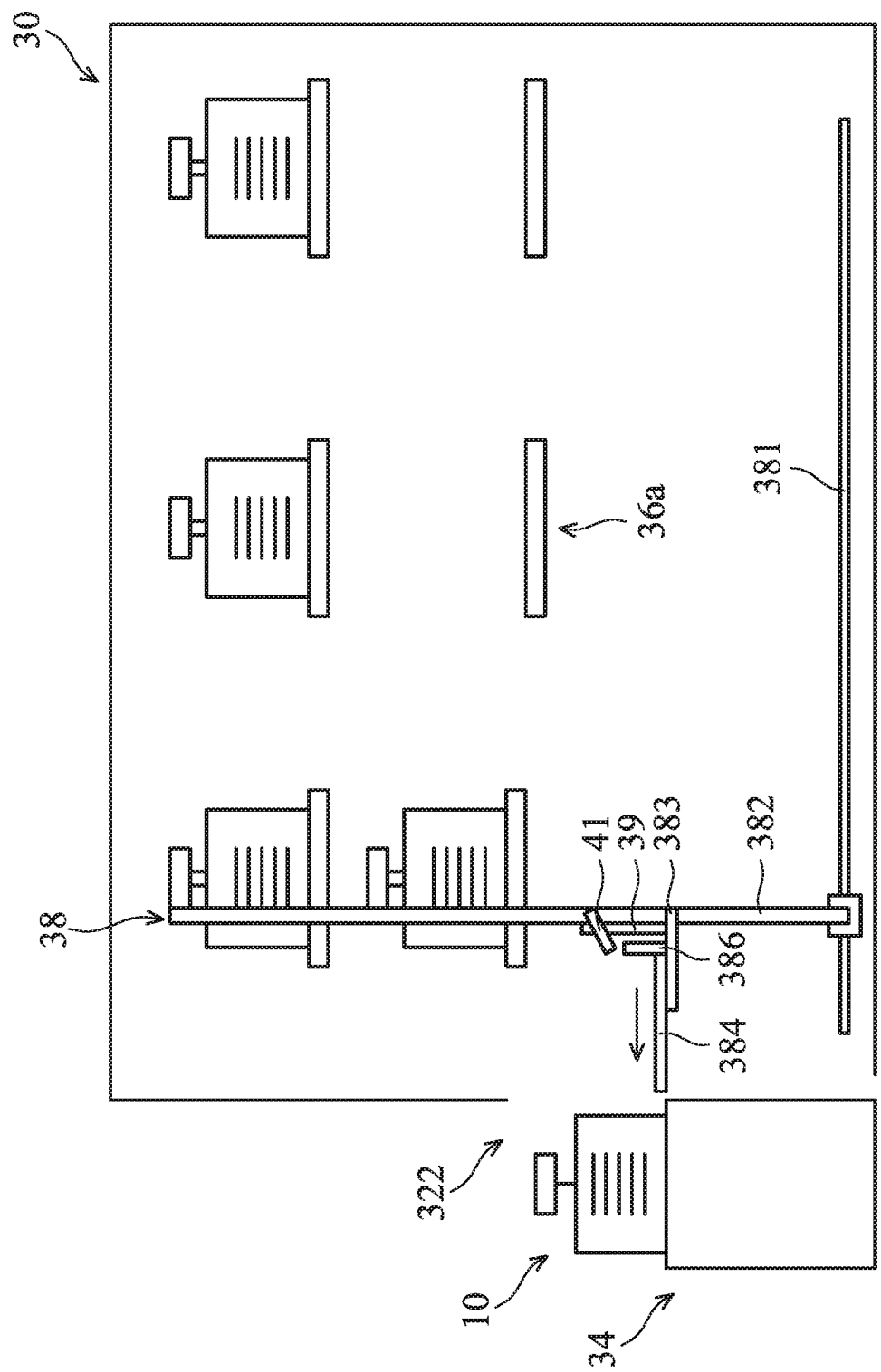
FIG. 6 is a schematic view of one stage of a method for transferring a container, in accordance with some embodiments.

The method 60 includes operation S1, in which the transferring mechanism 38 is moved to a first position that is adjacent to an original space on which the container 10 is placed. In some embodiments, in order to transfer the container 10 which is placed on the original space, the transferring mechanism 38 is moved to a first position, as shown in FIG. 6, so as to allow the robotic arm 383 to directly face the access door 322 of the stocker 30. When the transferring mechanism 38 is moved to the first position, the optical receiver 41 is able to produce an image of the bottom edge of the container 10 that is adjacent to the original space.

In some embodiments, before the movement of the transferring mechanism 38 in operation S1, the optical receiver 41 is mounted on the transferring mechanism 38, and the orientation angle of the optical receiver 41 is adjusted so as to allow the targeted subject to be imaged when the transferring mechanism 38 is moved to a first position. In some embodiments, the orientation angle of the optical receiver 41 is adjusted manually and maintained at a predetermined angle during the movement of the transferring mechanism 38. In some embodiments, the orientation angle of the optical receiver 41 is dynamically adjusted by an electrical actuator according to the position of the transferring mechanism 38.

In some embodiments, before the movement of the transferring mechanism 38 in operation S1 or during the movement of the transferring mechanism 38 in operation S1 the container is placed on the original space by a vehicle of the inter-bay transportation apparatus 22 or a vehicle of the intra bay transportation apparatus 28 (FIG. 1).

The method 60 also includes operation S2, in which an inspection process is performed. In the inspection process, a first image of the original space or the container 10 is produced. In some embodiments, once the transferring mechanism 38 is moved to the first position as shown in FIG. 6, the optical receiver 41 is operated to produce a first image of the original space and/or the container 10. In some embodiments, as shown in FIG. 7A, at least a bottom edge 11 of the container 10 and an upper portion of the original space that is in contact with the container 10 are imaged. The first image of the original space or the container 10 is then transmitted to the image processor 42 for image analysis.

The method 60 also includes operation S3, in which the result of an image analysis of the first image is generated so as to determine if an abnormality occurs. In some embodiments, the image processor 42 performs an image analysis of the first image. The image analysis includes reading the real-time video image captured by the optical receiver 41. The image analysis further includes recognizing the bottom edge 11 of the container 10. In addition, the image analysis includes constructing a movable reference line M1 that is overlapped or parallel to the bottom edge 11 of the container 10.

Moreover, the image analysis includes comparing the first image with a first template image by employing a predetermined algorithm, such as matrix multiplication. As shown in FIG. 7A, the first template image shows a horizontal reference line H1. The horizontal reference line H1 indicates a line that represents the correct position of the bottom edge 11 of the container 10 if the container 10 is centered relative to the original space. The horizontal reference line H1 may extend in a horizontal direction that is parallel to a floor of a FAB where the stocker 30 is located. The data associated with the first template image may be recorded in a database and sent to the image processor 42 before the image analysis is performed on the first image. The image processor 42 determines if the movable reference line M1 is parallel to or overlaps the horizontal line H1 and passes the result to the FDC module 50.

FIG. 7A shows an example of a first image captured by the optical receiver 41 in a normal condition. In cases where the container 10 is properly located on the original space, the bottom edge 11 of the container 10 is parallel to the upper surface of the original space. As a result, the image analysis of the first image shown in FIG. 7A represents that the movable reference line M1 of the first image is parallel to or overlaps with the horizontal reference line H1 of the template image. The image processor 42 sends data indicative of the outcome of the image analysis to the FDC module 50, and the FDC module 50 determines that the result of the image analysis is acceptable and the method continues to operation S4.

In operation S4, the container 10 is removed from the original space and moved to a second position that is adjacent to the destination space. Specifically, when the result of the image analysis is acceptable, the FDC module 50 issues a signal to the transferring mechanism 38 to drive the robotic arm 383 of the transferring mechanism 38 to move the blade 384 toward the container 10 in the direction indicated by the arrow shown in FIG. 6 so as to place the container 10 on the blade 384.

Figure 8:
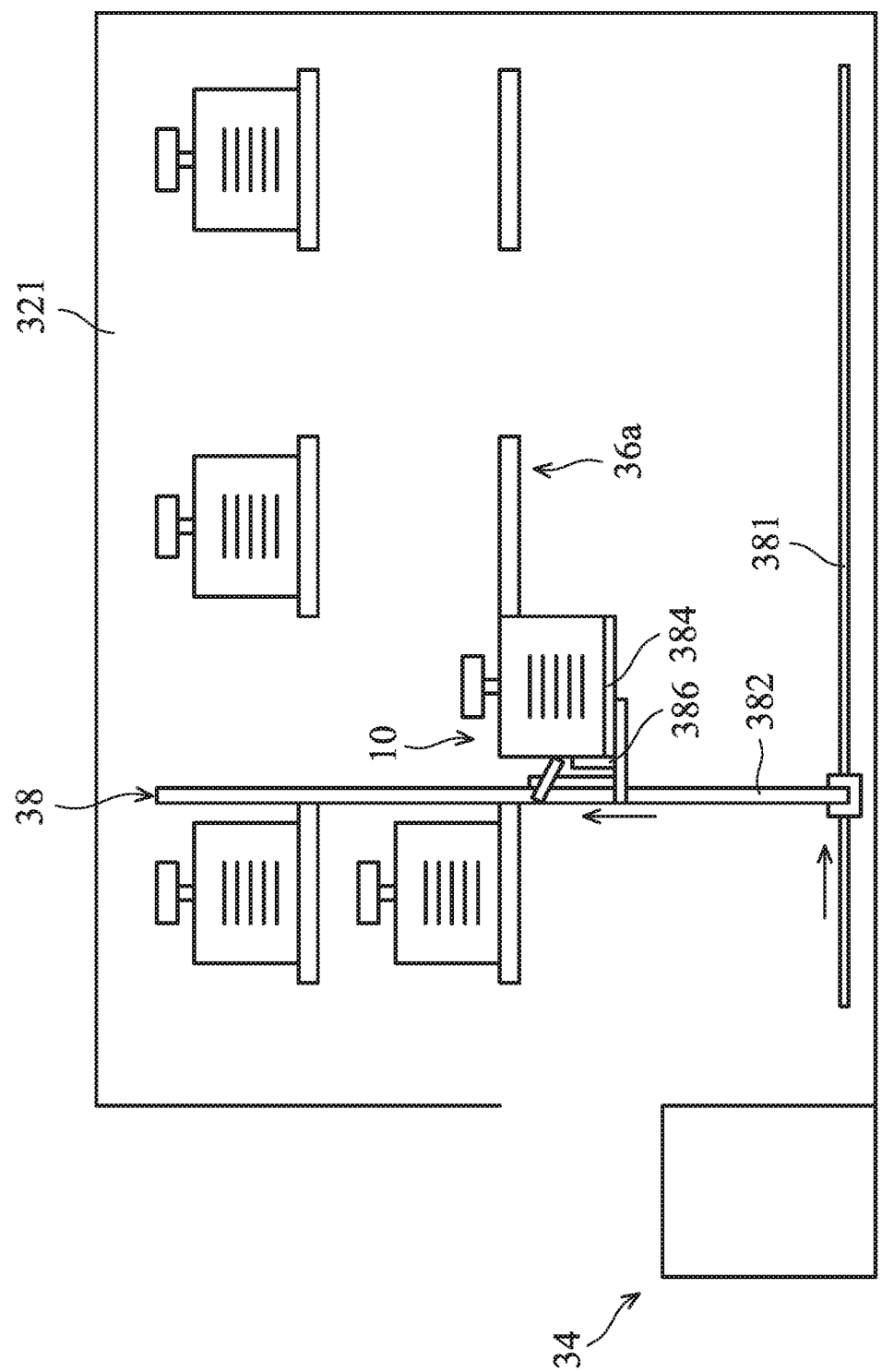
FIG. 8 is a schematic view of one stage of a method for transferring a container, in accordance with some embodiments.
Figure 9:
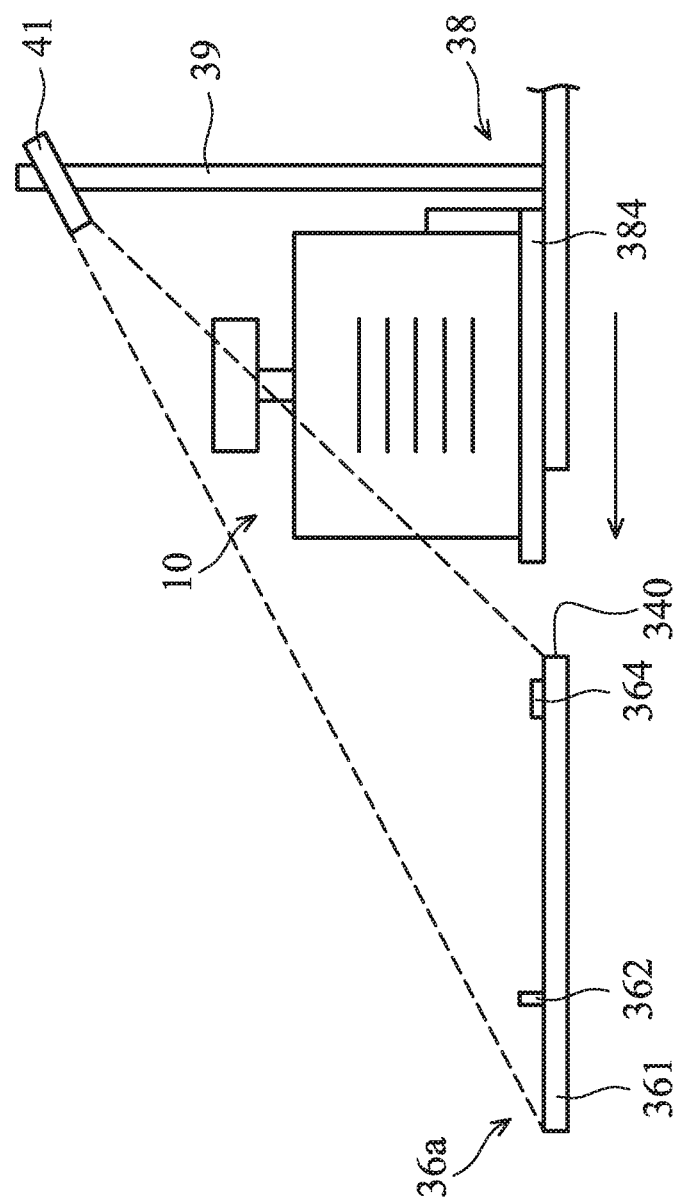
FIG. 9 is a schematic view of one stage of a method for transferring a container, in accordance with some embodiments.

Afterwards, the transferring mechanism 38 removes the container 10 from the first position which is adjacent to the original space and moves toward a second position that is adjacent to the designation space along the directions indicated by the arrows shown in FIG. 8. During the movement of the transferring mechanism 38, the crane 382 and the rail 381 are configured to move the robotic arm 383 along the length of the longitudinal side wall 321. In addition, the crane 382 is configured to move the robotic arm 383 along the height of the longitudinal side wall 321. Therefore, the blade 384 and the container 10 are moved to the second position as shown in FIG. 9. When the transferring mechanism 38 is moved to the second position, the optical receiver 41 is able to produce an image of the designation space.

Figure 7B:
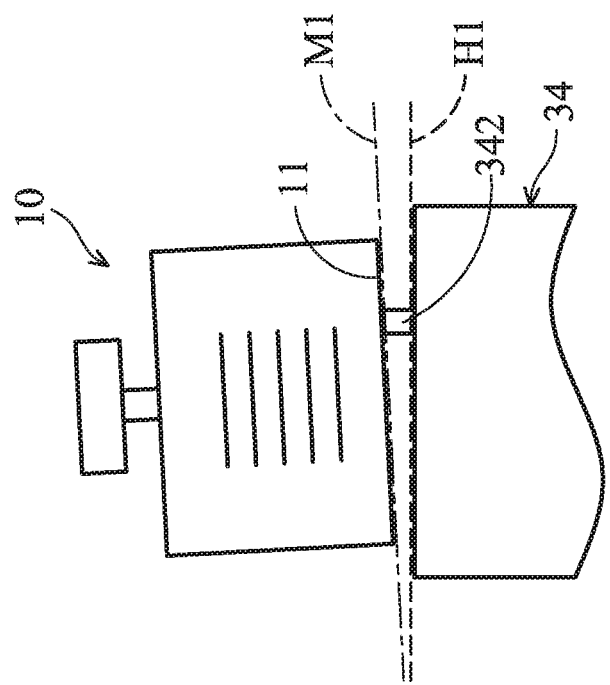
FIG. 7B is an example of a first image recorded by an optical receiver in an abnormal condition, in accordance with some embodiments.
Figure 7A:
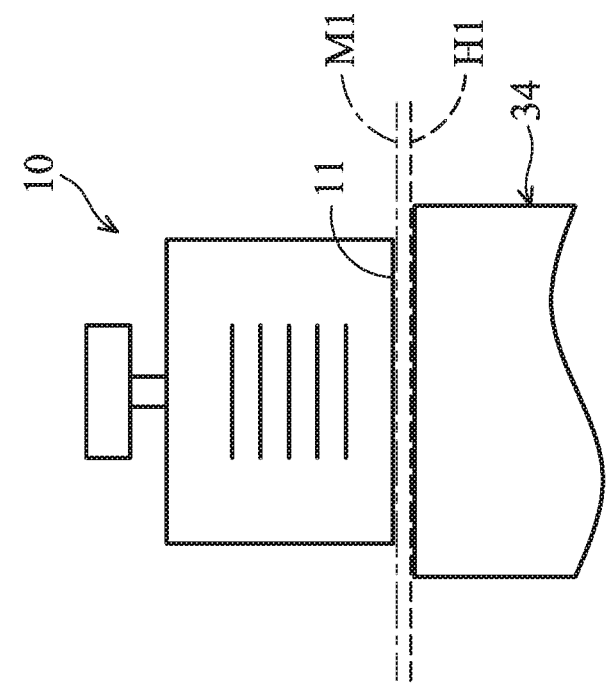
FIG. 7A is an example of a first image recorded by an optical receiver in a normal condition, in accordance with some embodiments.

FIG. 7B shows an example of a first image captured by the optical receiver 41 in an abnormal condition. In cases where the container 10 is obliquely positioned on the original space due to the bottom of the container 10 abutting the coupling pin 342, the bottom edge 11 of the container 10 is not parallel to the upper surface of the original space. As a result, the image analysis of the first image shown in FIG. 7B represents that the movable reference line M1 of the first image is not parallel to and doesn't overlap with the horizontal reference line H1 of the template image. The image processor 42 sends data indicative of the outcome of the image analysis to the FDC module 50, and the FDC module 50 determines that the result of the image analysis is not acceptable and the method continues to operation S10.

In operation S10, the FDC module 50 will take immediate action and inform maintenance personnel to properly handle it. As a result, damage to the container 10 or the transferring mechanism 38 for transferring the container 10 caused by the container transfer being performed under irregular conditions can be mitigated or avoided, and wafer scrap can be reduced.

Figure 10A:
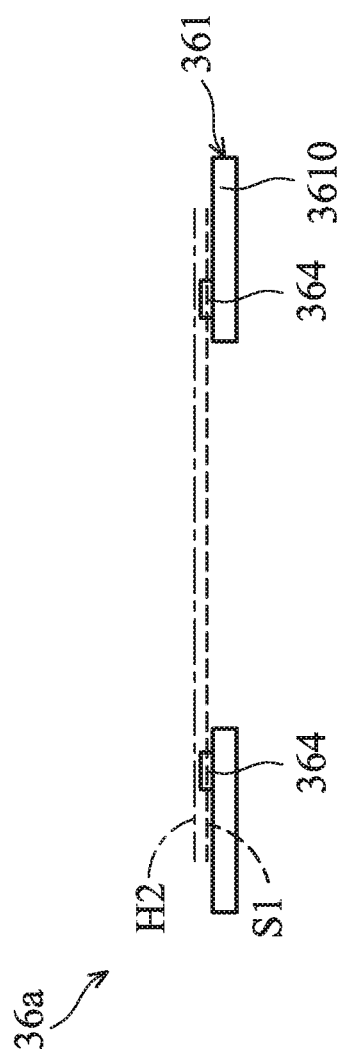
FIG. 10A is an example of a second image recorded by an optical receiver in a normal condition, in accordance with some embodiments.

The method 60 also includes operation S5, in which another inspection process is performed. In the inspection process of operation S5, a second image of the destination space is produced. In some embodiments, once the transferring mechanism 38 has moved the container 10 to the second position as shown in FIG. 9, the optical receiver 41 is operated to produce a second image of the destination space. In some embodiments, as shown in FIG. 10A, at least the front edge 3610 of the plate 361 and the embossments 364 are imaged by the optical receiver 41. The second image of the destination space is then transmitted to the image processor 42 for image analysis.

The method 60 also includes operation S6, in which the result of an image analysis of the second image is generated so as to determine if an abnormality occurs. In some embodiments, the image processor 42 performs an image analysis of the second image. The image analysis includes reading the real-time video image captured by the optical receiver 41. The image analysis further includes recognizing at least two reference points of the destination space. In addition, the image analysis includes constructing a stationary reference line S1 that connects the two reference points.

In the embodiments shown in FIG. 10A, the two embossments 364 are selected as the two reference points for image analysis. However, it should be appreciated that other elements of the destination space can be selected as the reference points. For examples, the coupling pins 362 (FIG. 3) can be selected as the two reference points for image analysis.

Moreover, the image analysis includes comparing the second image with a second template image by employing a predetermined algorithm, such as matrix multiplication. As shown in FIG. 10A, the second template image shows a horizontal reference line H2. The horizontal reference line H2 indicates a line that represents the correct position of the reference points if the destination space is preserved as a desired condition. The horizontal reference line H2 may be extended in a horizontal direction. The data associated with the second template image may be recorded in a database and passed to the image processor 42 before the image analysis is performed on the second image. The image processor 42 determines if the stationary reference line S1 is parallel to or overlaps the horizontal line H2. Afterwards, the image processor 42 passes the result of the image analysis of the second image to the FDC module 50.

FIG. 10A shows an example of a second image captured by the optical receiver 41 in a normal condition. In cases where the destination space is preserved as a desired condition, the two embossments 364 are located at the same horizontal level. As a result, the image analysis of the second image shown in FIG. 10A represents that the stationary reference line S1 of the second image is parallel to or overlaps with the horizontal reference line H2 of the template image. The image processor 42 passes data indicative of the outcome of the image analysis of the second image to the FDC module 50, and the FDC module 50 determines that the result of the image analysis is acceptable and the method continues to operation S7.

In operation S7, the container 10 is placed on the destination space. In some embodiments, when the result of the image analysis is acceptable, the FDC module 50 issues a signal to the transferring mechanism 38 to drive the robotic arm 383 of the transferring mechanism 38 to move toward the destination space in the direction indicated by the arrow shown in FIG. 9 so as to place the container 10 on the plate 361. Afterwards, the robotic arm 383 is retrieved back to the second position along an opposite direction as indicated by the arrow shown in FIG. 11.

Figure 10B:
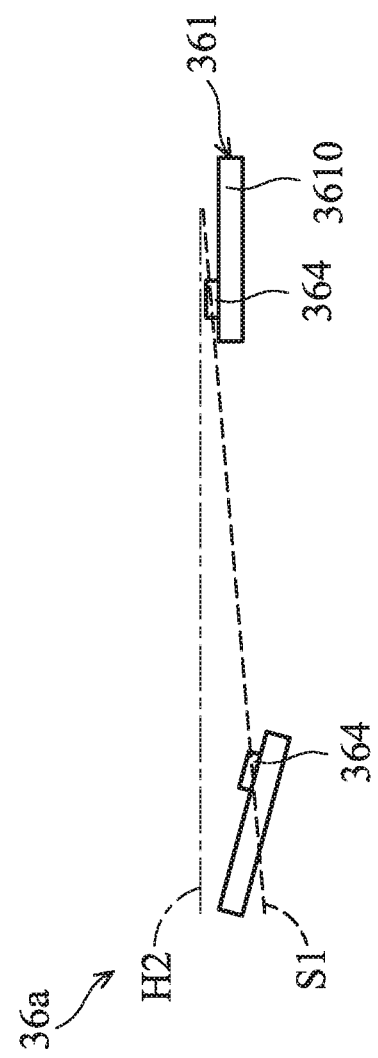
FIG. 10B is an example of a second image recorded by an optical receiver in an abnormal condition, in accordance with some embodiments.

FIG. 10B show an example of a second image captured by the optical receiver 41 in an abnormal condition. In cases where the destination space is not preserved as a desired condition due to collision or other factors, it may be that the two embossments 364 are not located at the same horizontal level. As a result, the image analysis of the second image shown in FIG. 10B represents that the stationary reference line S1 of the second image is not parallel to and doesn't overlap with the horizontal reference line H2 of the template image. The image processor 42 passes data indicative of the outcome of the image analysis of the second image to the FDC module 50, and the FDC module 50 determines that the result of the image analysis is not acceptable and the method continues to operation S10.

In operation S10, the FDC module 50 will take immediate action and inform maintenance personnel to properly handle it. As a result, damage to the container 10, the transferring mechanism 38, or the destination space caused by the container transfer being performed under irregular conditions can be mitigated or avoided, and wafer scrap can be reduced.

Figure 11:
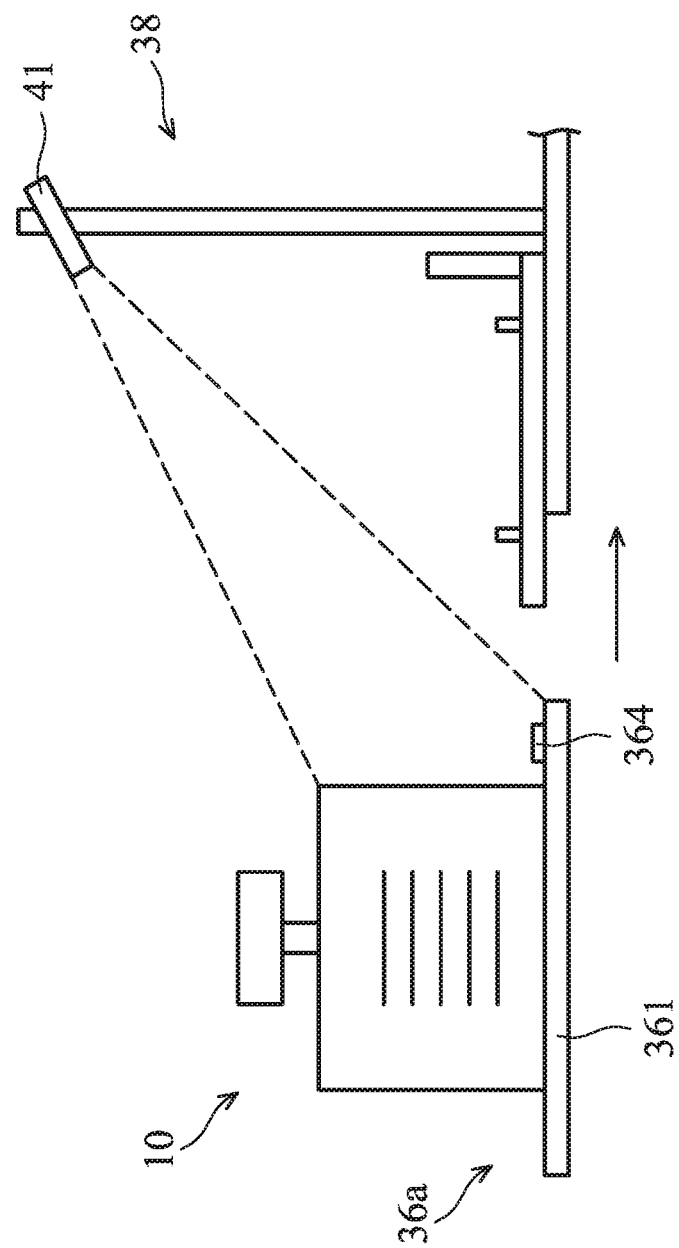
FIG. 11 is a schematic view of one stage of a method for transferring a container, in accordance with some embodiments.

The method 60 also includes operation S8, in which yet another inspection process is performed. In the inspection process of operation S8, a third image of the destination space and/or the container 10 is produced after the container 10 is deposited to the destination space. In some embodiments, once the transferring mechanism 38 is moved back to the second position as shown in FIG. 11, the optical receiver 41 is operated to produce the third image of the destination space or the container 10. In some embodiments, as shown in FIG. 12A, the front edge 3610 of the plate 361 and the embossments 364 are imaged by the optical receiver 41. Additionally, the bottom edge 11 of the container 10 is imaged by the optical receiver 41. The third image of the destination space and/or the container 10 is then transmitted to the image processor 42 for image analysis.

The method 60 also includes operation S9, in which the result of an image analysis of the third image is generated so as to determine if an abnormality occurs. In some embodiments, the image processor 42 performs an image analysis of the third image. The image analysis includes reading the real-time video image captured by the optical receiver 41. The image analysis further includes recognizing the bottom edge 11 of the container 10 and the two embossments 364 of the destination space. In addition, the image analysis includes constructing a stationary reference line S2 that connects the two embossments 364, and a movable reference line M2 that is overlapped or parallel to the bottom edge 11 of the container 10 as well. Moreover, the image analysis includes determining whether the stationary reference line S2 and the movable reference line M2 are parallel to one another. Afterwards, the result of the image analysis of the third image is sent to the FDC module 50.

FIG. 12A shows an example of a third image captured by the optical receiver 41 in a normal condition. In cases where the container 10 is properly located on the destination space, the bottom edge 11 of the container 10 is parallel to the plate 361 of the destination space. As a result, the image analysis of the third image shown in FIG. 12A represents that the movable reference line M2 is parallel to the stationary reference line S2. The image processor 42 passes data indicative of the outcome of the image analysis of the third image to the FDC module 50, and the FDC module 50 determines that the result of the image analysis is acceptable.

When the result of the image analysis is acceptable, the transportation of the container 10 from the original space to the destination space is finished. Afterwards, the FDC module 50 issues a signal to the transferring mechanism 38 to move robotic arm 383 to the other position in the stocker 30 to transfer the other container 10.

FIG. 12B shows an example of a third image captured by the optical receiver 41 in an abnormal condition. In cases where an element of the destination space, such as the plate 361, is damaged or deformed due to collision during the movement of the blade 384 (FIG. 3) in operation S7, the image analysis of the third image may represent that the movable reference line M2 is parallel to the stationary reference line S2 even though both the container 10 and the destination space are oblique.

In order to detect this abnormal condition shown in FIG. 12B, the image analysis further includes calculating an angle of the stationary reference line S2 and/or the movable reference line M2 relative to a horizontal reference line H3 of a third template image by employing a predetermined algorithm, such as matrix multiplication. The horizontal reference line H3 indicates a line that represents the correct position of the reference points if the destination space is preserved as a desired condition. The horizontal reference line H3 may be extended in a horizontal direction. The data associated with the third template image may be recorded in a database and passed to the image processor 42 before the image analysis is performed on the third image.

The image processor 42 calculates the angle θ formed between the stationary reference line S2 and the horizontal reference line H3 or the angle θ formed between the movable reference line M2 and the horizontal reference line H3. Afterwards, the image processor 42 sends data indicative of the outcome of the image analysis of the third image to the FDC module 50. If the calculated angle is smaller than the present value, the FDC module 50 determines that the result of the image analysis is acceptable; otherwise, the FDC module 50 determines that the result of the image analysis is not acceptable. In some embodiments, the angle θ formed between the stationary reference line S2 and the horizontal reference line H3 or the angle θ formed between the movable reference line M2 and the horizontal reference line H3 is in a range from about 1 degree to about 2 degrees. In some other embodiments, the angle θ is less than about 2 degrees.

FIG. 12C shows an example of a third image captured by the optical receiver 41 in an abnormal condition. In cases where the container 10 is obliquely positioned on the destination space due to the bottom of the container 10 abutting the coupling pin 362, the bottom edge 11 of the container 10 is not parallel to plate 361 of the destination space. As a result, the image analysis of the first image shown in FIG. 12B represents that the movable reference line M2 is not parallel to the stationary reference line S2. The image processor 42 passes data indicative of the outcome of the image analysis to the FDC module 50, and the FDC module 50 determines that the result of the image analysis is not acceptable and the method continues to operation S10.

In operation S10, the FDC module 50 will take immediate action and inform maintenance personnel to properly handle it. As a result, damage to the container 10 due to improper placement of the container 10 on the destination space can be mitigated or avoided, and wafer scrap can be reduced.

While the above discussion uses a transfer of the container 10 from the load port 34 to the storage shelf 36a as an example, it is contemplated that the method 60 can be implemented by the stocker 30 to move the container 10 from any original space within the stocker 30 to any destination space within the stocker 30. In cases where the container 10 is moved from the storage shelf 36a to the load port 34, the storage shelf 36a is referred to as the original space, and the load port 34 is referred to as the destination space. In some other embodiments, the container 10 is moved from the storage shelf 36a to a purge station (not shown in figures) located in the main body 32 so as to purge nitrogen or another purging gas into the container 10. In this case, the storage shelf 36a is referred to as the original space, and the purge station is referred to as the destination space.

In some illustrated embodiments, the transferring mechanism 38 patrols the main body 32 of the stocker 30 with no container 10 loaded thereon and stays in front of each of the storage shelves 36a, 36b, 36c and 36d for a few seconds to image each of the storage shelves 36a, 36b, 36c and 36d. Afterwards, the images captured by the optical receiver 41 are transmitted to the image processor 42 for image analysis so as to check the health of storage shelves 36a, 36b, 36c and 36d, and inform maintenance personnel to perform maintenance if any of the storage shelves 36a, 36b, 36c and 36d is not preserved in the desired condition.

Embodiments of method for transferring containers in the stocker perform an inspection process to determine if an abnormality occurs. The inspection process is performed before a withdrawal of the container from an original space to make sure that the container is properly placed on the original space. In addition, the inspection process is performed before a deposit of the container to a destination space to confirm that the destination space is in a proper condition for receiving the container. Moreover, the inspection process is performed after the deposit of the container to the destination space to ensure that the container is perfectly placed on the destination space. Since the health of the hardware in the stocker for receiving the container can be monitored in real time, maintenance can be executed immediately when a fault occurs. Additionally, because the transferring process of the container is halted when an abnormality is detected, concerns about the container falling can be eased, and damage to the article held in the container can be prevented or mitigated.

In accordance with some embodiments, a method for transferring a container configured to hold at least one article used in semiconductor fabrication, comprising: moving a transferring mechanism to a first position that is adjacent to the original space; producing an image of an edge of the container that is adjacent to the original space using an optical receiver before the container is moved to a destination space; and performing an image analysis of the image to determine whether to move the container to the destination space.

In accordance with some embodiments, a method for transferring a container configured to hold at least one article used in semiconductor fabrication, comprising: producing an first image of an edge of the container at a first position that is adjacent to an original space using an optical receiver; moving the container from the first position to a second position that is adjacent to a destination space using a transferring mechanism when the result of an image analysis of the first image is accepted; producing an second image of the destination space using the optical receiver; and performing an image analysis of the second image to determine whether to place the container at the destination space.

In accordance with some embodiments, a stocker for storing containers, comprising: a transferring mechanism, configured to move at least one container from a first position that is adjacent to an original space to a second position that is adjacent to a destination space, wherein the container is configured to hold at least one article used in semiconductor fabrication and the transferring mechanism comprises: a robotic arm; and a blade, positioned on the robotic arm, and configured to place the container at the destination space; an optical receiver, positioned at the transferring mechanism, and configured to produce an image of an edge of the container that is placed at the destination space; an image processor, connected to the optical receiver, and configured to perform an image analysis of the image to determine if an abnormality occurs.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for transferring a container configured to hold at least one article used in semiconductor fabrication, comprising:
   moving a transferring mechanism to a first position that is adjacent to the original space;
   producing an image of an edge of the container that is adjacent to the original space using an optical receiver before the container is moved to a destination space; and
   performing an image analysis of the image to determine whether to move the container to the destination space.

2. The method as claimed in claim 1, wherein the step of performing an image analysis of the image comprises:
   constructing a movable reference line that is overlapped or parallel to the edge of the container; and
   comparing the movable reference line with a horizontal reference line extend in a horizontal direction.

3. The method as claimed in claim 2, wherein the horizontal reference line indicates a correct position of the edge of the container when the container is centered relative to the original space.

4. The method as claimed in claim 2, wherein the step of comparing the movable reference line with a horizontal reference line comprises:
   determining if the movable reference line is parallel to or overlaps the horizontal reference line.

5. The method as claimed in claim 4, wherein the step of performing an image analysis of the image further comprises:
   determining the result of the image analysis is not acceptable when the movable reference line is not parallel to or not overlaps the horizontal reference line; and
   issuing an alarm signal when the result of the image analysis is not acceptable.

6. The method as claimed in claim 4, wherein the step of performing an image analysis of the image further comprises:
   determining the result of the image analysis is acceptable when the movable reference line is parallel to or overlaps the horizontal reference line; and
   moving the container to a second position that is adjacent to the destination space by the transferring mechanism when the result of the image analysis is acceptable.

7. The method as claimed in claim 6, wherein the destination space comprises a shelf of a stocker for storing the container.

8. The method as claimed in claim 1, wherein the original space comprises a load port of a stocker.

9. A method for transferring a container configured to hold at least one article used in semiconductor fabrication, comprising:
   producing an first image of an edge of the container at a first position that is adjacent to an original space using an optical receiver;
   moving the container from the first position to a second position that is adjacent to a destination space using a transferring mechanism when the result of an image analysis of the first image is accepted;
   producing an second image of the destination space using the optical receiver; and
   performing an image analysis of the second image to determine whether to place the container at the destination space.

10. The method as claimed in claim 9, wherein performing the image analysis of the second image comprises:
    recognizing at least two reference points of the destination space;
    constructing a stationary reference line that connects the reference points; and
    determining if the stationary reference line is parallel to or overlaps a horizontal reference line extend in a horizontal direction.

11. The method as claimed in claim 10, wherein performing the image analysis of the second image further comprises:
    determining the result of the image analysis of the second image is not acceptable when the stationary reference line is not parallel to or not overlaps the horizontal reference line; and
    issuing an alarm signal when the result of the image analysis of the second image is not acceptable.

12. The method as claimed in claim 10, wherein performing the image analysis of the second image further comprises:
    determining the result of the image analysis of the second image is acceptable when the stationary reference line is parallel to or overlaps the horizontal reference line; and
    issuing a signal to the transferring mechanism to drive the transferring mechanism to place the container at the destination space when the result of the image analysis of the second image is acceptable.

13. The method as claimed in claim 9, wherein the original space comprises a load port of a stocker, and the destination space comprises a shelf of the stocker for storing the container.

14. The method as claimed in claim 9, wherein performing the image analysis of the second image comprises:
    comparing the second image with a template image by employing a predetermined algorithm.

15. A stocker for storing containers, comprising:
    a transferring mechanism, configured to move at least one container from a first position that is adjacent to an original space to a second position that is adjacent to a destination space, wherein the container is configured to hold at least one article used in semiconductor fabrication and the transferring mechanism comprises:
    a robotic arm; and
    a blade, positioned on the robotic arm, and configured to place the container at the destination space;
    an optical receiver, positioned at the transferring mechanism, and configured to produce an first image of an edge of the container at the first position, an second image of the destination space, and an third image of the edge of the container that is placed at the destination space;
    an image processor, connected to the optical receiver, and configured to perform an image analysis of the first image, the second image and the third image to determine if abnormality occurs.

16. The stocker as claimed in claim 15, further comprising a supporting assembly, positioned on the robotic arm, wherein the optical receiver is positioned at the supporting assembly.

17. The stocker as claimed in claim 15, wherein the image processor is configured to:

constructing a stationary reference line that connects at least two reference points of the destination space and a movable reference line that is overlapped or parallel to the edge of the container;

determining if the stationary reference line is parallel to the movable reference line; and calculating an angle of the stationary reference line and/or the movable reference line relative to a horizontal reference line.

18. The stocker as claimed in claim 17, further comprising an FDC module, configured to detect faults within the stocker, wherein the FDC module issues an alarm signal when the angle is not smaller than a preset value.

19. The stocker as claimed in claim 17, further comprising an FDC module, configured to detect faults within the stocker, wherein the FDC module determines that the result of the image analysis is acceptable when the movable reference line is parallel to the stationary reference line.

20. The stocker as claimed in claim 19, wherein the FDC module issues a signal to drive the transferring mechanism to the other position for transferring other containers.

\* \* \* \* \*